(12) United States Patent
Choi et al.

(10) Patent No.: US 8,134,873 B2
(45) Date of Patent: Mar. 13, 2012

(54) FLASH MEMORY DEVICE AND PROGRAMMING/ERASING METHOD OF THE SAME

(75) Inventors: Dong-uk Choi, Seongnam-si (KR); Jung-dal Choi, Seoul (KR); Choong-ho Lee, Yongin-si (KR); Sung-hoi Hur, Seoul (KR); Min-tai Yu, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 293 days.

(21) Appl. No.: 12/591,428

(22) Filed: Nov. 19, 2009

(65) Prior Publication Data

US 2010/0128522 A1    May 27, 2010

(30) Foreign Application Priority Data

Nov. 27, 2008   (KR) .................. 10-2008-0118808

(51) Int. Cl.
*G11C 16/06* (2006.01)
(52) U.S. Cl. ........... 365/185.2; 365/185.09; 365/185.18; 365/185.17; 365/185.29
(58) Field of Classification Search ............... 365/185.2, 365/185.09, 185.17–185.18, 185.29, 185.23, 365/185.03, 185.33
See application file for complete search history.

(56) References Cited

U.S. PATENT DOCUMENTS 7,974,130 B2 * 7/2011 Nakamura et al. ......... 365/185.2

FOREIGN PATENT DOCUMENTS

| KR | 10-2004-0070484 A | 8/2004 |
| KR | 10-2006-0060528 A | 6/2006 |
| KR | 10-2007-0018216 A | 2/2007 |

* cited by examiner

*Primary Examiner* — David Lam
(74) *Attorney, Agent, or Firm* — Lee & Morse, P.C.

(57) ABSTRACT

A flash memory device includes a bulk region, first through nth memory cell transistors arranged in a row on the bulk region, first through nth word lines respectively connected to gates of the first through nth memory cell transistors, a first dummy cell transistor connected to the first memory cell transistor, a first dummy word line connected to a gate of the first dummy cell transistor, a first selection transistor connected to the first dummy cell transistor, a first selection line connected to a gate of the first selection transistor, and a voltage control unit connected to the first selection line, the voltage control unit being adapted to output to the first selection line a voltage lower than a voltage applied to the bulk region, in an erasing mode for erasing the first through nth memory cell transistors.

20 Claims, 7 Drawing Sheets

| | APPLIED VOLTAGE |
|---|---|
| SSL | Min[$V_1$ (12V), $V_B$] |
| DWL1 | $V_3$ (5V) |
| WL1~WLn | $V_4$ (0V) |
| DWL2 | $V_3$ (5V) |
| GSL | Min[$V_1$ (12V), $V_B$] |
| 120 (BULK REGION) | $V_2$ (20V) |

FIG. 5

| | APPLIED VOLTAGE |
|---|---|
| SSL | Floating |
| DWL1 | 8V |
| WL1~WLn | 0V |
| DWL2 | 8V |
| GSL | Floating |
| 320 (BULK REGION) | 20V |

FIG. 7

| | APPLIED VOLTAGE |
|---|---|
| SSL | $V_1$ (12V) |
| DWL1 | $V_3$ (5V) |
| WL1~WLn | $V_4$ (0V) |
| DWL2 | $V_3$ (5V) |
| GSL | $V_1$ (12V) |
| 620 (BULK REGION) | $V_2$ (20V) |

FIG. 8

| | $TM_1$ | $TM_n$ | $TM_2$ |
|---|---|---|---|
| SSL | $V_{cc}$ | | |
| DWL1 | $\dfrac{V_{cc} + V_{pgm}}{2}$ | $V_{pass}$ | $V_{pass}$ |
| WL1 | $V_{pgm}$ | $V_{pass}$ | $V_{pass}$ |
| WL2 | $V_{pass}$ | $V_{pass}$ | $V_{pgm}$ |
| WLn-1 | $V_{pass}$ | $V_{pass}$ | $V_{pass}$ |
| WLn | $V_{pass}$ | $V_{pgm}$ | $V_{pass}$ |
| DWL2 | $V_{pass}$ | $\dfrac{V_{pgm}}{2}$ | $V_{pass}$ |
| GSL | 0V | | |
| 120 (BULK REGION) | 0V | | |

…

FLASH MEMORY DEVICE AND PROGRAMMING/ERASING METHOD OF THE SAME

BACKGROUND

1. Field

Example embodiments relate to a flash memory device and a method for programming/erasing the same.

2. Description of the Related Art

Non-volatile memory devices, e.g., flash memory devices, may be electrically erasable and programmable memory devices. The non-volatile memory devices may maintain data even when power is not supplied. For example, a flash memory device may be a NAND-type non-volatile memory device having memory transistors arranged on NAND strings.

SUMMARY

Embodiments are directed to a flash memory device and a method for programming/erasing the same, which substantially overcome one or more of the problems due to the limitations and disadvantages of the related art.

According to an aspect of the inventive concept, there is provided a flash memory device including a bulk region, first through nth memory cell transistors arranged in a row on the bulk region, n being a natural number that is equal to or greater than two, first through nth word lines respectively connected to gates of the first through nth memory cell transistors, a first dummy cell transistor connected to the first memory cell transistor, a first dummy word line connected to a gate of the first dummy cell transistor, a first selection transistor connected to the first dummy cell transistor, a first selection line connected to a gate of the first selection transistor, and a voltage control unit connected to the first selection line, the voltage control unit being adapted to output to the first selection line a voltage lower than a voltage applied to the bulk region, in an erasing mode for erasing the first through nth memory cell transistors. The voltage control unit may apply one of a first voltage and a voltage of the bulk region, which is lower than the other, to the first selection line in an erasing mode for erasing the first through nth memory cell transistors.

If a second voltage is applied to the bulk region, the voltage of the bulk region may be increased from an initial voltage of the bulk region to the second voltage applied to the bulk region.

A difference between the first and second voltages may be smaller than a voltage that can cause a tunneling effect in the first selection transistor.

According to another aspect of the inventive concept, there is provided a flash memory device including a bulk region; first through nth memory cell transistors (n is a natural number that is equal to or greater than two) which are arranged in a row on the bulk region; first through nth normal word lines which are respectively connected to gates of the first through nth memory cell transistors, first and second dummy cell transistors which are respectively connected to the first and nth memory cell transistors, first and second dummy word lines which are respectively connected to gates of the first and second dummy cell transistors, first and second selection transistors which are respectively connected to the first and second dummy cell transistors, first and second selection lines which are respectively connected to gates of the first and second selection transistors, and a voltage control unit which applies a first voltage to the first and second selection lines and applies a second voltage to the bulk region, in an erasing mode for erasing the first through nth memory cell transistors.

A difference between the first and second voltages may be smaller than a voltage that can cause a tunneling effect in the first selection transistor or the second selection transistor.

According to another aspect of the inventive concept, there is provided an erasing method of a flash memory device including a plurality of strings each including a plurality of memory cells which are arranged in a row on a bulk region, a first dummy cell transistor, a first dummy word line, a first selection transistor, and a first selection line, the erasing method including comparing a first voltage with a voltage of the bulk region in an erasing mode for erasing memory cell transistors; and applying one of the first voltage and the voltage of the bulk region, which is lower than the other, to a first selection word line, based on a result of the comparing.

According to another aspect of the inventive concept, there is provided a programming method of a flash memory device including a plurality of strings each including a plurality of memory cells which are arranged in a row on a bulk region, a first dummy cell transistor, a first dummy word line, a first selection transistor, and a first selection line, the programming method including applying a programming voltage to a target programming normal word line connected to a gate of a programming target memory cell transistor and applying a pass voltage to the other normal word lines; applying a first voltage to the first selection line; and applying a second voltage to the first dummy word line.

If the programming target memory cell transistor is adjacent to the first dummy cell transistor, the second voltage may have a voltage level between the first voltage and the programming voltage.

BRIEF DESCRIPTION OF THE DRAWINGS

The above and other features and advantages will become more apparent to those of ordinary skill in the art by describing in detail exemplary embodiments with reference to the attached drawings, in which:

FIG. 5 illustrates a table of voltages applied to the comparative flash memory device illustrated in FIG. 4 in an erasing mode;

FIG. 7 is a table of voltages applied to a flash memory device in an erasing mode according to an example embodiment;

FIG. 8 is a table of voltages applied to a flash memory device in a programming mode according to an example embodiment;

DETAILED DESCRIPTION

Figure 1:
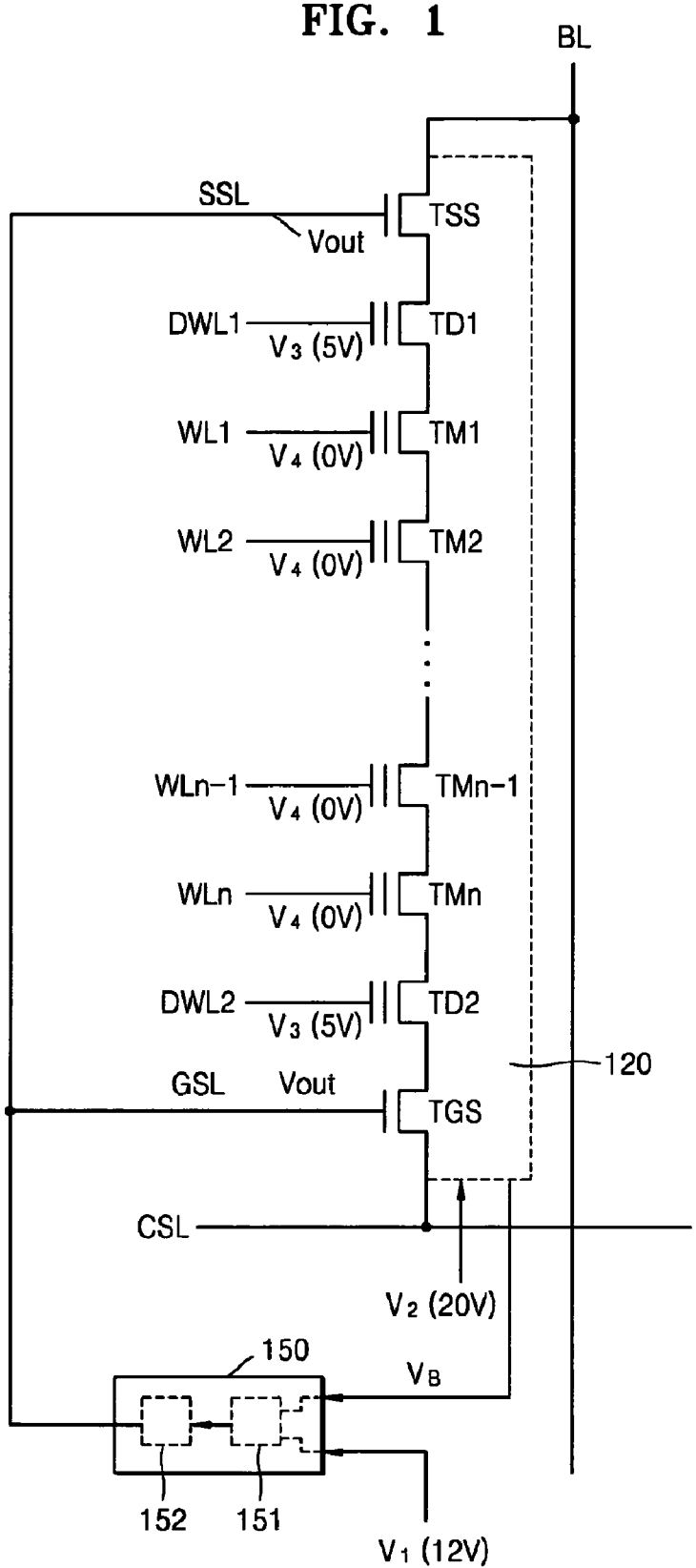
FIG. 1 illustrates a circuit diagram of a flash memory device according to an example embodiment.

Korean Patent Application No. 10-2008-0118808, filed on Nov. 27, 2008, in the Korean Intellectual Property Office, and entitled: "Flash Memory Device and Programming/Erasing Method of the Same," is incorporated by reference herein in its entirety.

Each of a plurality of memory cells in a flash memory device may include a cell transistor having a control gate, a floating gate, a source, and a drain. The cell transistor of the flash memory device may be programmed or erased via a Fowler-Nordheim (FN) tunneling mechanism.

For example, an erasing operation of the cell transistor in the memory cell may be performed by applying a ground voltage to the control gate, and applying a high voltage, e.g., a voltage higher than a source voltage, to a semiconductor substrate (or a bulk). According to such an erasing bias condition, a strong electric field is formed between the floating gate and the bulk due to a large voltage difference therebetween. As a result, electrons in the floating gate are emitted to the bulk due to an FN tunneling effect. In this case, a threshold voltage of the erased cell transistor may be reduced.

In another example, a programming operation of the cell transistor may be performed by applying the high voltage to the control gate, and by applying the ground voltage to the drain and the bulk. In such a bias condition, electrons are injected into the floating gate of the cell transistor due to the FN tunneling effect. In this case, the threshold voltage of the programmed cell transistor may be increased.

A state in which electrons are injected into the floating gate of the cell transistor is referred to as a programming state, and a state in which electrons are removed from the floating gate is referred to as an erasing state. A threshold voltage in the programming state is larger than about 0 V, and a threshold voltage in the erasing state is smaller than about 0 V.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of elements and regions may be exaggerated for clarity of illustration. It will also be understood that when an element is referred to as being "between" two elements or "connected to" another element, it can be the only element between two elements or connected to another element, or one or more intervening elements may also be present. Like reference numerals/characters refer to like elements throughout.

FIG. 1 illustrates a circuit diagram of a flash memory device according to an embodiment.

Referring to FIG. 1, the flash memory device according to an embodiment may include a first selection transistor TSS, a first dummy cell transistor TD1, first through nth memory cell transistors TM1 through TMn, a second dummy cell transistor TD2, and a second selection transistor TGS. Here, n is a natural number that is equal to or greater than two.

The first and second selection transistors TSS and TGS, the first and second dummy cell transistors TD1 and TD2, and the first through nth memory cell transistors TM1 through TMn may be formed on a bulk region 120.

As illustrated in FIG. 1, the first through nth memory cell transistors TM1 through TMn may be arranged in a row. The first and second dummy cell transistors TD1 and TD2 may be respectively connected to two ends of the first through nth memory cell transistors TM1 through TMn. That is, the first and second dummy cell transistors TD1 and TD2 may be respectively connected to the first memory cell transistor TM1 and the nth memory cell transistor TMn. The first and second selection transistors TSS and TGS may be respectively connected to the first and second dummy cell transistors TD1 and TD2, e.g., the first dummy cell transistor TD1 may be connected between the first memory cell transistor TM1 and the first selection transistor TSS.

Voltages may be applied to gates of the first and second selection transistors TSS and TGS, the first and second dummy cell transistors TD1 and TD2, and the first through nth memory cell transistors TM1 through TMn via corresponding lines. As illustrated in FIG. 1, first through nth word lines WL1 through WLn may be respectively connected to gates of the first through nth memory cell transistors TM1 through TMn. As further illustrated in FIG. 1, first and second dummy word lines DWL1 and DWL2 may be respectively connected to gates of the first and second dummy cell transistors TD1 and TD2, and first and second selection lines SSL and GSL may be respectively connected to the gates of the first and second selection transistors TSS and TGS. For example, the first selection transistor TSS may be a string selection transistor, and the second selection transistor TGS may be a ground selection transistor. It is noted, however, that any suitable configuration of the selection transistors is within the inventive concept, e.g., the first selection transistor TSS may be a ground selection transistor and the second selection transistor TGS may be a string selection transistor.

The first through nth memory cell transistors TM1 through TMn may be operated, e.g., programmed, read and/or erased, by applying various voltages, e.g., a programming voltage, a reading voltage and/or an erasing voltage, via first through the nth word lines WL1 through WLn to the gates of the first through nth memory cell transistors TM1 through TMn, respectively.

The flash memory device according to example embodiments may further include a voltage control unit 150. As illustrated in FIG. 1, the voltage control unit 150 may include a voltage comparator 151 and a voltage generator 152, and may apply voltage to at least one of the first and second selection transistors TSS and TGS via respective first and second selection lines SSL and GSL. For example, during an erasing mode, the voltage control unit 150 may output one of two voltage values to at least one of the first and second selection transistors TSS and TGS, e.g., in accordance with a voltage value measured in the bulk region 120. Operation of the voltage control unit 150 will be described in more detail below with respect to FIGS. 2 and 3.

Figures 2, 3:
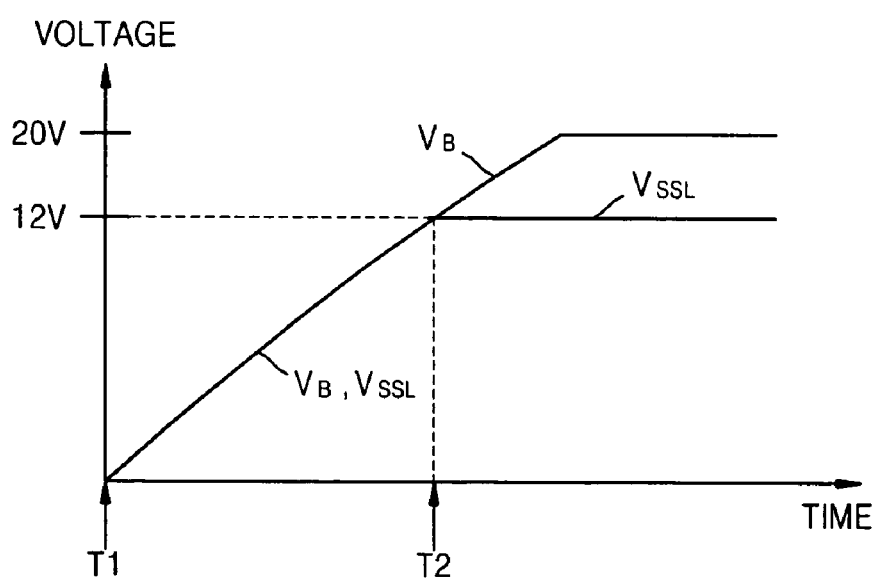
FIG. 2 is a table of voltages applied to a flash memory device in an erasing mode according to an example embodiment.
FIG. 3 illustrates a graph of a voltage of a first selection line and a voltage of a bulk region over time according to an example embodiment.

FIG. 2 is a table of exemplary voltage values applied to the flash memory device of FIG. 1 in an erasing mode.

In the erasing mode, all of the first through nth memory cell transistors TM1 through TMn illustrated in FIG. 1 may be erased at a time, e.g., simultaneously. Although only some of the first through nth memory cell transistors TM1 through TMn may be erased at a time, it is assumed in the current embodiment that all of the first through nth memory cell transistors TM1 through TMn are erased at a time.

Referring to FIGS. 1 and 2, in the erasing mode for erasing the first through nth memory cell transistors TM1 through TMn, a third voltage $V_3$, e.g., about 5 V, may be applied to the first and second dummy word lines DWL1 and DWL2, and a fourth voltage $V_4$, e.g., about 0 V, may be applied to the first through nth normal word lines WL1 through WLn. A second voltage $V_2$, e.g., about 20 V, may be applied to the bulk region 120.

The voltage control unit 150 may output one of a first voltage $V_1$ and a voltage $V_B$ to at least one of the first and second selection transistors TSS and TGS, e.g., to the first and second selection lines SSL and GSL. The first voltage $V_1$ may be, e.g., about 12 V, and the voltage $V_B$ may be a measured voltage of the bulk region 120. It is noted that the voltage $V_B$ does not refer to voltage applied to the bulk region 120, but refers to voltage measured in the bulk region 120. For example, when the second voltage $V_2$ is applied to the bulk region 120, the voltage $V_B$, i.e., the voltage measured in the bulk region 120, may be initially lower than the second voltage $V_2$ and may gradually increase, so only after a predetermined time the voltage $V_B$ may equal the second voltage $V_2$, as will be described in more detail below with reference to FIG. 3.

The voltage control unit 150 may output to at least one of the first and second selection transistors TSS and TGS a lower voltage of the first voltage $V_1$ and the voltage $V_B$. In other words, the voltage control unit 150 may determine which of the first voltage $V_1$, e.g., a constant value of about 12 V, and the voltage $V_B$, i.e., a measured voltage of the bulk region 120 that may vary over time, has a lower voltage value at a given time, so the lower voltage value may be output to at least one of the first and second selection transistors TSS and TGS. As such, since the voltage $V_B$ may not exceed the second voltage $V_2$ applied to the bulk region 120 and the voltage control unit 150 applies the lower one of the first voltage $V_1$ and the voltage $V_B$ to at least one of the first and second selection transistors TSS and TGS, the voltage applied to the selection lines by the voltage control unit 150 may not exceed the second voltage $V_2$, i.e., the voltage applied to the bulk region 120. That is, a voltage applied to the selection lines, e.g., the first selection line SSL, may not be larger than the voltage applied to the bulk region 120, e.g., may not be increased before the voltage of the bulk region 120 is increased. Accordingly, deterioration of the flash memory device may be prevented. It is noted that for convenience, hereinafter, application of voltage only to the first selection line SSL will be described; however, the second selection line TGS may be operated in a substantially same manner and simultaneously with the first selection line SSL.

FIG. 3 illustrates a graph of variation of voltage applied to the first selection line SSL with respect to time. FIG. 3 will be described in conjunction with FIGS. 1 and 2.

Referring to FIG. 3, at time T1 the second voltage $V_2$, e.g., about 20 V, is applied to the bulk region 120. As illustrated in FIG. 3, at time T1, the voltage $V_B$, i.e., represented by the curve in the graph, may be substantially lower than the second voltage $V_2$, i.e., lower than about 20 V. Over time, as illustrated in FIG. 3, the voltage $V_B$ may gradually increase, e.g., at time T2 the voltage $V_B$ may equal about 12 V. Once the voltage $V_B$ reaches the voltage value of the second voltage $V_2$, e.g., about 20 V, the voltage $V_B$ may be maintained at about 20 V. Since between time T1 and T2 the voltage $V_B$ is lower than the first voltage $V_1$, e.g., lower than about 12 V, the voltage controller 150 may output the voltage $V_B$ as $V_{SSL}$ to the first selection line SSL. After time T2, i.e., once the voltage $V_B$ is equal to or larger than the first voltage $V_1$, the voltage controller 150 may output the first voltage $V_1$ as $V_{SSL}$ to the to the first selection line SSL.

In the erasing mode, a difference between the second voltage $V_2$, e.g., about 20 V, and the first voltage $V_1$, e.g., about 12 V, may be smaller than a voltage that may cause a tunneling effect in the first selection transistor TSS. The third voltage $V_3$, e.g., about 5 V, applied to the first dummy word line DWL1 in the erasing mode may be higher than the fourth voltage $V_4$, e.g., about 0 V, applied to the first through nth normal word lines WL1 through WLn in the erasing mode, and may be lower than the first voltage $V_1$. For example, the third voltage $V_3$ may be an average of the fourth voltage $V_4$ and the first voltage $V_1$, e.g., the third voltage $V_3$ may be about 6 V instead of about 5 V.

As illustrated in FIG. 1, the voltage control unit 150 may include the voltage comparator 151 and the voltage generator 152. The voltage comparator 151 may receive a first input of the first voltage $V_1$ and a second input of the measured voltage $V_B$, and may compare the first voltage $V_1$ with the voltage $V_B$. The voltage generator 152 may apply one of the first voltage $V_1$ and the voltage $V_B$, i.e., a lower of the two values, to the first selection line SSL based on a comparison result of the voltage comparator 151.

Referring back to FIG. 1, the flash memory device according to example embodiments may further include a charge supply line CSL and a bit line BL. The charge supply line CSL may supply charges to a string including the first and second selection transistors TSS and TGS. The charge supply line CSL may be a common source line.

Figure 4:
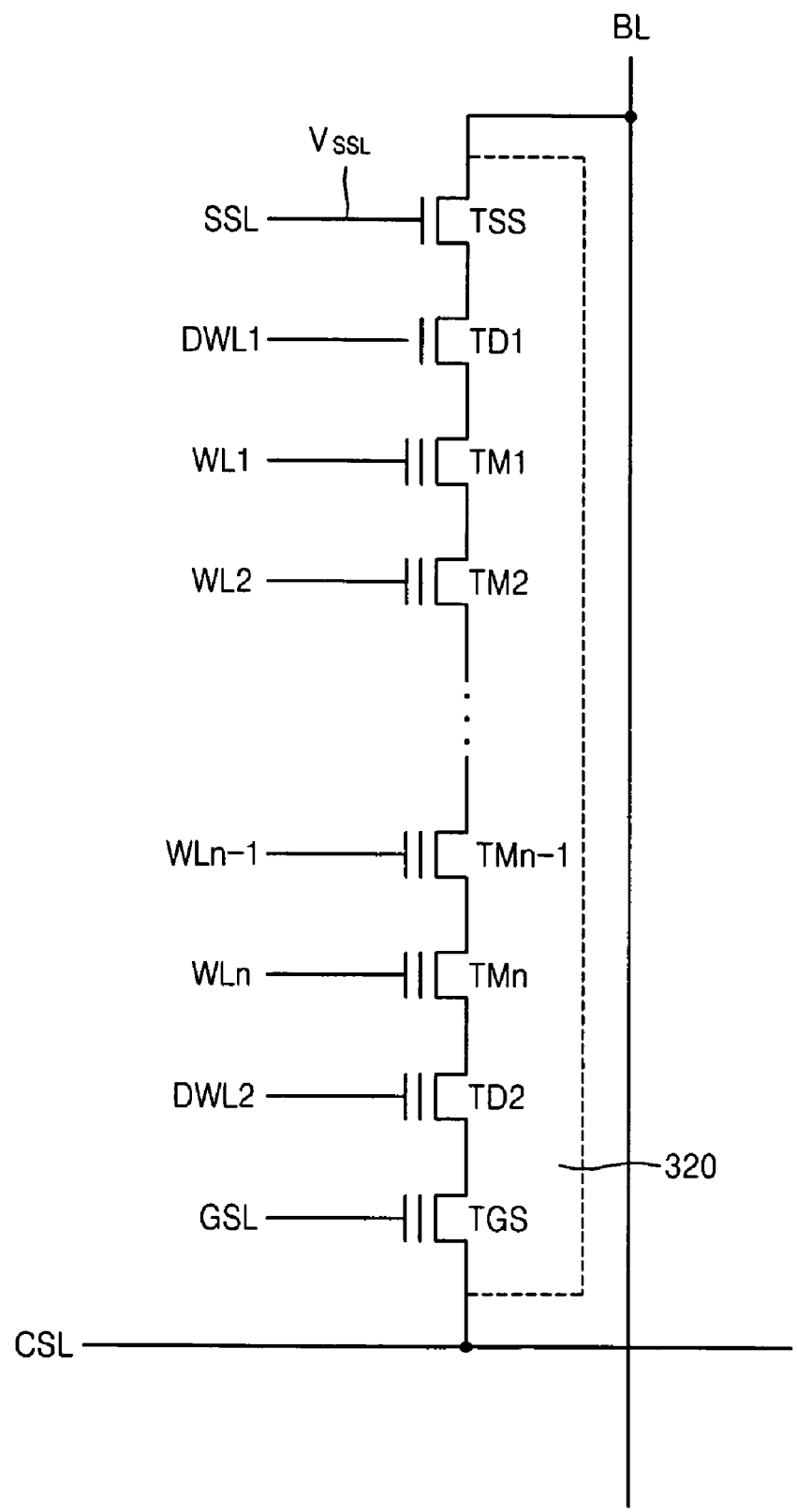
FIG. 4 illustrates a circuit diagram of a flash memory device according to a comparative example.

According to example embodiments, a flash memory device may include a voltage control unit adapted to output to the selection lines a lower voltage than voltage applied to the bulk region. In contrast, as illustrated in FIGS. 4 and 5, in a comparative flash memory device without a voltage control unit, first and second selection lines SSL and GSL may be floated in an erasing mode. Thus, a voltage of the first and second selection lines SSL and GSL of the comparative flash memory device may increase to a voltage value of a bulk region 320, e.g., a voltage $V_{SSL}$ applied to the first selection line SSL may increase before the voltage of the bulk region 320 is increased. As such, a leakage current may occur between the first selection line SSL and the first dummy word line DWL1, as well as between the second selection line GSL and the second dummy word line DWL2, thereby causing deterioration of the flash memory device.

Figure 6:
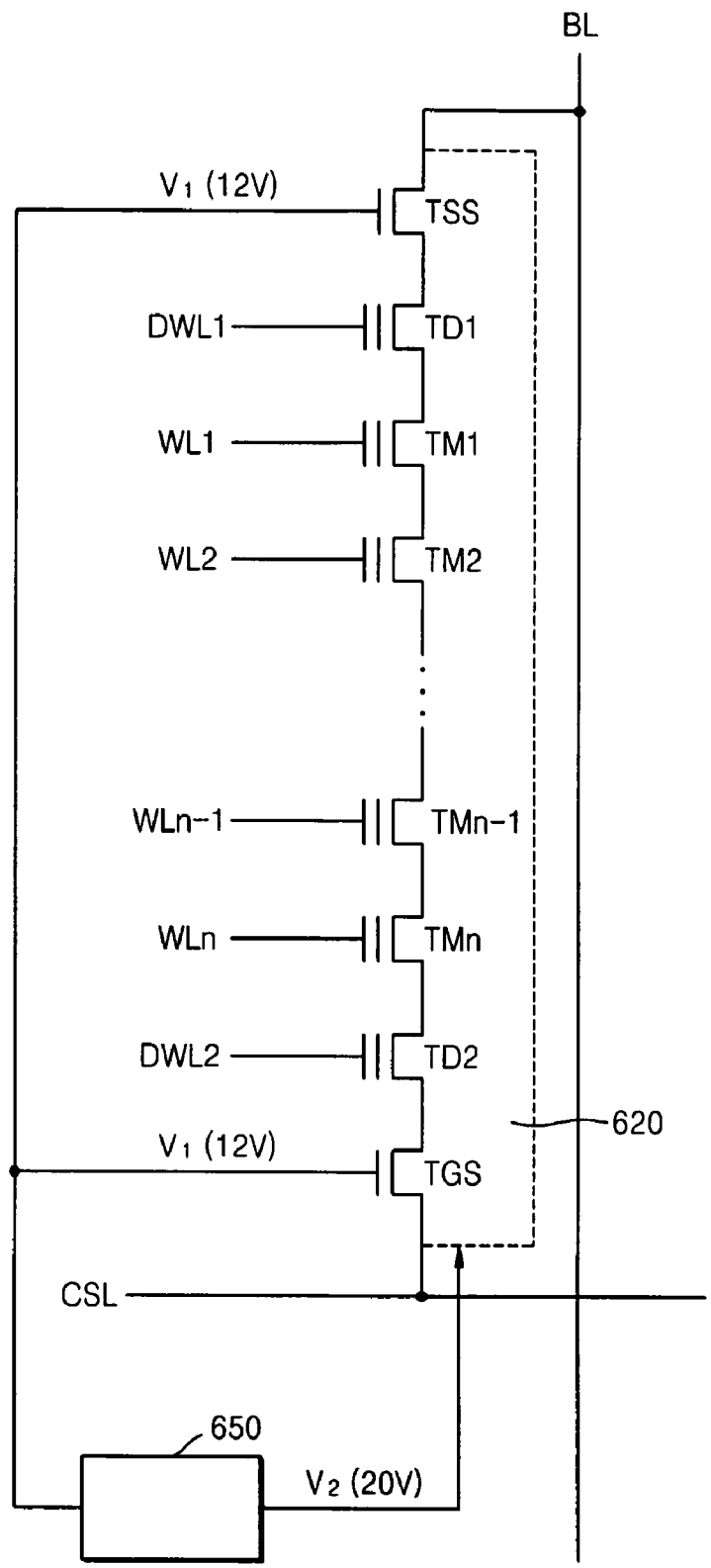
FIG. 6 illustrates a circuit diagram of a flash memory device according to another embodiment of the inventive concept.

FIG. 6 illustrates a circuit diagram of a flash memory device according to another embodiment. Referring to FIG. 6, the flash memory device may include the first selection transistor TSS, the first dummy cell transistor TD1, the first through nth memory cell transistors TM1 through TMn, the second dummy cell transistor TD2, and the second selection transistor TGS. The first and second selection transistors TSS and TGS, the first and second dummy cell transistors TD1 and TD2, and the first through nth memory cell transistors TM1 through TMn may be arranged on a bulk region 620 in the substantially same way described previously with reference to FIG. 1.

Hereinafter, the differences between the flash memory device illustrated in FIG. 6 and the flash memory device illustrated in FIG. 1 will be described. The flash memory device illustrated in FIG. 6 may include a voltage control unit 650. In an erasing mode, the voltage control unit 650 may apply different voltages to the selection lines and the bulk region 620, so a voltage value applied to the first and second selection lines SSL and GSL may be lower than the voltage applied to the bulk region 620.

FIG. 7 illustrates a table of voltages applied to the flash memory device illustrated in FIG. 6 in an erasing mode. For example, referring to FIGS. 6 and 7, in the erasing mode, the voltage control unit 650 may apply the first voltage $V_1$, e.g., about 12 V, to the first and second selection lines SSL and GSL, and may apply the second voltage $V_2$, e.g., about 20 V, to the bulk region 620.

As such, in the flash memory device illustrated in FIG. 6, since the first and second selection lines SSL and GSL are not floated, a voltage of the first and second selection lines SSL and GSL may not increase to a voltage of the bulk region 620. Thus, a leakage current between the first and second selection lines SSL and GSL, and first and second dummy word lines DWL1 and DWL2 may be prevented.

An erasing method of a flash memory device according to an embodiment may include comparing voltages to determine a lower voltage and applying the lower voltage to at least one selection line. The comparing of the voltages may include comparing a first voltage with a voltage of a bulk region. The applying of the voltage may include applying to the selection line a lower voltage than a voltage applied to the bulk region.

FIG. 8 illustrates a table of voltages applied in a programming method of a flash memory device according to an embodiment. The programming method according to an embodiment may be applied to the flash memory device illustrated in FIG. 1 or FIG. 6. Hereinafter, the flash memory device illustrated in FIG. 1 will be representatively described, and thus, FIG. 8 will be described in conjunction with FIG. 1.

Referring to FIGS. 1 and 8, in a programming mode, the first selection transistor TSS may be turned on. For this, a source voltage $V_{CC}$ may be applied to the gate of the first selection transistor TSS via the first selection line SSL. Also, the second selection transistor TGS may be turned off. For this, a ground voltage, i.e., about 0 V, may be applied to the gate of the second selection transistor TGS via the second selection line GSL.

In a case when the first memory cell transistor TM1 is a programming target memory cell transistor, i.e., when a programming target memory cell transistor is adjacent to the first dummy cell transistor TD1, the programming method is performed as described below.

A programming voltage $V_{pgm}$ may be applied to the gate of the first memory cell transistor TM1 through the first word line WL1. A fifth voltage, e.g., a voltage value of about $(V_{CC}+V_{pgm})/2$, may be applied to the gate of the first dummy cell transistor TD1 through the first dummy word line DWL1. A pass voltage $V_{pass}$ may be applied to the second through nth word lines WL2 through WLn, and to the second dummy word line DWL2.

The pass voltage $V_{pass}$ may be higher than threshold voltages of the second through nth memory cell transistors TM2 through TMn and the second dummy cell transistor TD2. Thus, the second through nth memory cell transistors TM2 through TMn and the second dummy cell transistor TD2 may be turned on due to the pass voltage $V_{pass}$. The programming voltage $V_{pgm}$ may be higher than the pass voltage $V_{pass}$, and the fifth voltage, e.g., $(V_{CC}+V_{pgm})/2$, may have a voltage level between the programming voltage $V_{pgm}$ and the source voltage $V_{CC}$. It is noted, however, that even though FIG. 8 illustrates that the fifth voltage equals an average voltage value between the programming voltage $V_{pgm}$ and the source voltage $V_{CC}$, i.e., $(V_{CC}+V_{pgm})/2$, the inventive concept is not limited thereto, i.e., the fifth voltage may equal any voltage value between the programming voltage $V_{pgm}$ and the source voltage $V_{CC}$, e.g., $V_{pgm}/2$.

As further illustrated in FIG. 8, when the second memory cell transistor TM2 is the programming target memory cell transistor, i.e., when the programming target memory cell transistor is not adjacent to the first dummy cell transistor TD1, the programming method is performed as described below.

The programming voltage $V_{pgm}$ may be applied to the gate of the second memory cell transistor TM2 through the second word line WL2. The pass voltage $V_{pass}$ may be applied to the first and third through nth word lines WL1 and WL3 through WLn and the first and second dummy word lines DWL1 and DWL2.

As described above, if the programming target memory cell transistor is adjacent to the first dummy cell transistor TD1, a voltage between the programming voltage $V_{pgm}$ and the source voltage $V_{CC}$ may be applied to the first dummy word line DWL1. The same principal is applied to a case when the programming target memory cell transistor is adjacent to the second dummy word line DWL2. On the other hand, if the programming target memory cell transistor is not adjacent to the first dummy cell transistor TD1, the pass voltage $V_{pass}$ may be applied to the first dummy word line DWL1. As such, a voltage difference between a word line and a dummy word line may be reduced in the programming mode, thereby decreasing a leakage current between the word line and an adjacent dummy word line.

Each memory cell transistor included in a flash memory device according to an embodiment may be a NAND flash memory cell transistor. The flash memory device may be employed in a memory card for storing high-capacity data or in a data processing system, e.g., a mobile device or a desk top computer.

Figure 9:
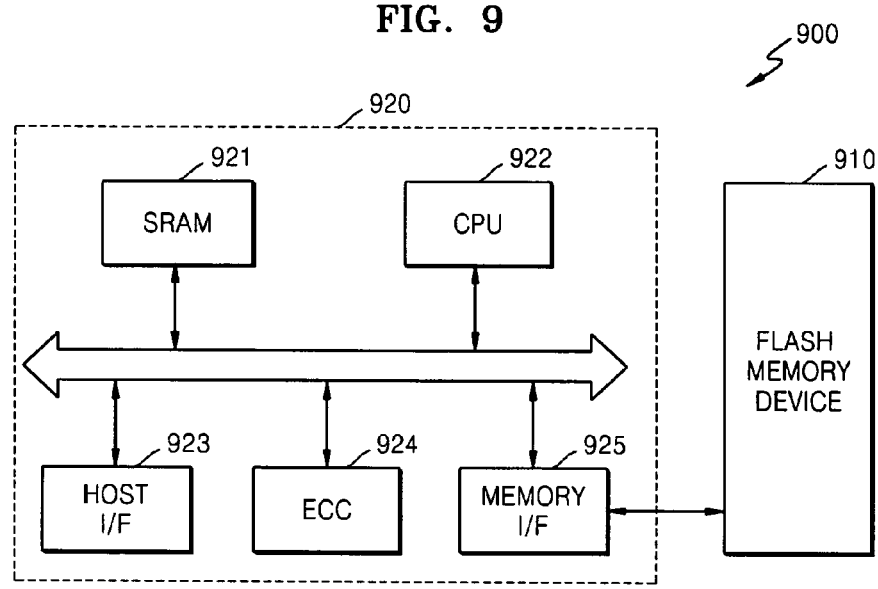
FIG. 9 illustrates a block diagram of a memory card according to an example embodiment.

FIG. 9 illustrates a block diagram of a memory card 900 according to an embodiment. Referring to FIG. 9, the memory card 900 may include a flash memory device 910 according to an embodiment. The memory card 900 may include a memory controller 920 for controlling various data exchanges between a host and the flash memory device 910.

As illustrated in FIG. 9, a static random access memory (SRAM) 921 may be used as an operation memory of a central processing unit (CPU) 922. A host interface 923 may include a data exchange protocol of the host connected to the memory card 900. An error correction block 924 may detect and correct errors included in data read from the flash memory device 910. A memory interface 925 may interface with the flash memory device 910. The CPU 922 may perform various control operations for data exchanges with the memory controller 920. Although not shown in FIG. 9, the memory card 900 may further include a read-only memory ROM (not shown) that stores code data in order to interface with the host. The flash memory device 910 and the memory card 900 may be provided to a memory system, e.g., a solid state disk (SSD) device.

Figure 10:
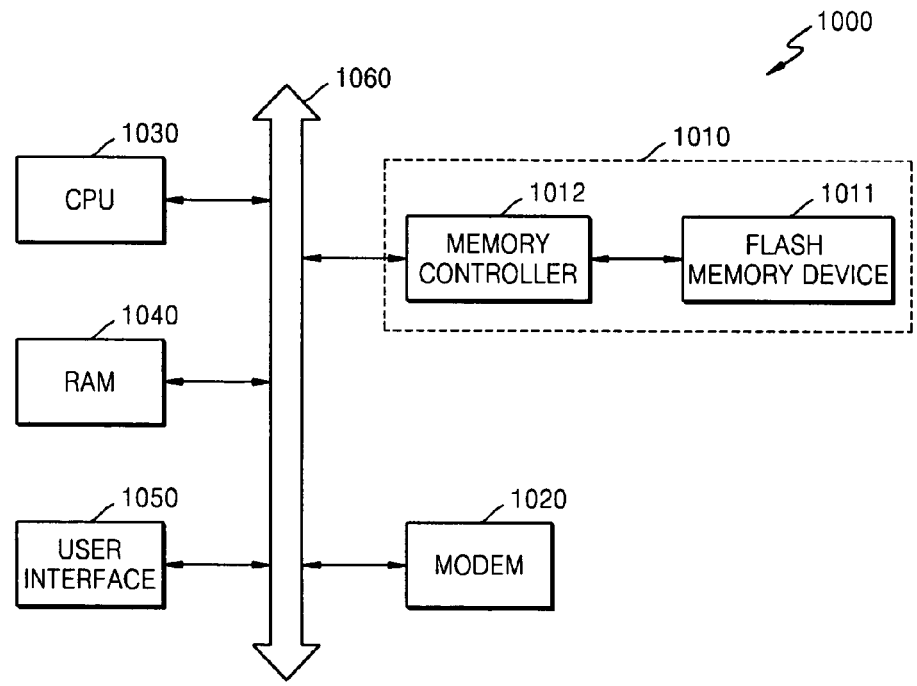
FIG. 10 illustrating a block diagram of a data processing system according to an example embodiment.

FIG. 10 illustrates a block diagram of a data processing system 1000 according to an embodiment. Referring to FIG. 10, the data processing system 1000 may include a flash memory device 1011 according to an embodiment. The flash memory device 1011 may be a portion of a non-volatile memory system 1010. The data processing system 1000 may further include a modem 1020, a CPU 1030, a random access memory (RAM) 1040, and a user interface 1050, which may be separately connected to a system bus 1060. The non-volatile memory system 1010 may store data processed by the CPU 1030 and data input from outside the data processing system 1000. Here, the non-volatile memory system 1010 may be formed of an SSD, and, in this case, the data processing system 1000 may stably store high-capacity data in the non-volatile memory system 1010. As the reliability is increased, the non-volatile memory system 1010 may reduce its resources required to correct errors and, thus, may provide a fast data exchange function to the data processing system 1000. Although not shown in FIG. 10, the data processing system 1000 may further include, e.g., an application chipset, a camera image processor (CIS), a mobile dynamic random access memory (DRAM), or an input/output (I/O) device.

As the use of mobile devices, e.g., cellular phones, personal data assistants (PDAs), digital cameras, portable game consoles, and MP3 players (MP3Ps), is increased, a flash memory device according to an embodiment may be commonly used as a code storage as well as a data storage. Also, the flash memory device may be used in home application devices, e.g., high-definition televisions (HDTVs), digital versatile disk (DVD) players, routers, and global positioning systems (GPSs).

Furthermore, the flash memory device may be packaged into various packages, e.g., a package on package (POP), a ball grid array (BGA), a chip scale package (CSP), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), a small-outline integrated circuit (SOIC), a shrink small outline package (SSOP), a thin small outline package (TSOP), a system in package (SIP), a multi chip package (MCP), a wafer-level fabricated package (WFP), and a wafer-level processed stack package (WSP).

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A flash memory device, comprising:
   a bulk region;
   first through nth memory cell transistors arranged in a row on the bulk region, n being a natural number that is equal to or greater than two;
   first through nth word lines respectively connected to gates of the first through nth memory cell transistors;
   a first dummy cell transistor connected to the first memory cell transistor;
   a first dummy word line connected to a gate of the first dummy cell transistor;
   a first selection transistor connected to the first dummy cell transistor;
   a first selection line connected to a gate of the first selection transistor; and
   a voltage control unit connected to the first selection line, the voltage control unit being adapted to output to the first selection line a voltage lower than a voltage applied to the bulk region, in an erasing mode for erasing the first through nth memory cell transistors.

2. The flash memory device as claimed in claim 1, wherein the voltage control unit is adapted to output to the first selection line, in an erasing mode for erasing the first through nth memory cell transistors, a lower voltage of a first voltage and a second voltage, the first voltage being lower than the voltage applied to the bulk region, and the second voltage being a voltage measured in the bulk region.

3. The flash memory device as claimed in claim 2, wherein the second voltage increases gradually from an initial voltage of the bulk region to the voltage applied to the bulk region.

4. The flash memory device as claimed in claim 3, wherein a difference between the first voltage and the voltage applied to the bulk region is smaller than a voltage that can cause a tunneling effect in the first selection transistor.

5. The flash memory device as claimed in claim 2, wherein the voltage control unit includes:
   a voltage comparator adapted to compare the first voltage with the second voltage; and
   a voltage generator adapted to apply a lower voltage of the first and second voltages to the first selection line, based on a comparison result of the voltage comparator.

6. The flash memory device as claimed in claim 2, wherein a third voltage applied to the first dummy word line in the erasing mode is higher than a fourth voltage applied to the first through nth word lines in the erasing mode, the third voltage being lower than the first voltage.

7. The flash memory device as claimed in claim 6, wherein the third voltage is an average of the first voltage and the fourth voltage.

8. The flash memory device as claimed in claim 1, further comprising:
   a second dummy cell transistor connected to the nth memory cell transistor;
   a second dummy word line connected to a gate of the second dummy cell transistor;
   a second selection transistor connected to the second dummy cell transistor; and
   a second selection line connected to a gate of the second selection transistor,
   wherein the voltage control unit is connected to the second selection line, the voltage control unit being adapted to output a substantially same voltage to the first and second selection lines in the erasing mode.

9. The flash memory device as claimed in claim 8, wherein one of the first and second selection transistors is a string selection transistor and a remaining of the first and second selection transistors is a ground selection transistor.

10. The flash memory device as claimed in claim 1, wherein the voltage control unit is adapted to output, in an erasing mode for erasing the first through nth memory cell transistors, a first voltage to the first selection line and a second voltage to the bulk region, the first voltage being lower than the second voltage.

11. The flash memory device as claimed in claim 10, further comprising:
   a second dummy cell transistor connected to the nth memory cell transistor;
   a second dummy word line connected to a gate of the second dummy cell transistor;
   a second selection transistor connected to the second dummy cell transistor; and
   a second selection line connected to a gate of the second selection transistor,
   wherein the voltage control unit is connected to the second selection line, the voltage control unit being adapted to output a substantially same voltage to the first and second selection lines in the erasing mode,
   and wherein a difference between the first and second voltages is smaller than a voltage that can cause a tunneling effect in the first selection transistor or the second selection transistor.

12. The flash memory device as claimed in claim 11, wherein a voltage applied to the first and second dummy word lines in the erasing mode is lower than a fourth voltage applied to the first through nth word lines in the erasing mode.

13. A flash memory card including the flash memory device as claimed in claim 1.

14. A flash memory system including the flash memory device as claimed in claim 1.

15. A method of erasing a flash memory device having first through nth memory cell transistors arranged in a row on a bulk region and connected to respective first through nth word lines, a first dummy cell transistor connected to the first memory cell transistor and having a first dummy word line, and a first selection transistor connected to the first dummy cell transistor and having a first selection line connected to the first selection transistor, the method comprising:
   determining a lower voltage of a first voltage and a second voltage via a voltage control unit, the first voltage being lower than a voltage applied to the bulk region, and the second voltage being voltage measured in the bulk region; and applying the lower voltage of the first and second voltages to the first selection word line by the voltage control unit.

16. The erasing method as claimed in claim 15, wherein the second voltage increases gradually from an initial voltage of the bulk region to the voltage applied to the bulk region, a difference between the first voltage and the voltage applied to the bulk region being smaller than a voltage that can cause a tunneling effect in the first selection transistor.

17. The erasing method as claimed in claim 15, wherein the voltage measured in the bulk region substantially equals the voltage applied to the bulk region, such that the voltage control unit outputs the first voltage to the first selection word line and the second voltage to the bulk region.

18. The erasing method as claimed in claim 15, wherein applying the lower voltage includes applying a third voltage to the first dummy word line, the third voltage being higher than a fourth voltage applied to the first through nth word lines and lower than the first voltage.

19. A method of programming a flash memory device having first through nth memory cell transistors arranged in a row on a bulk region and connected to respective first through nth word lines, a first dummy cell transistor connected to the first memory cell transistor and having a first dummy word line, and a first selection transistor connected to the first dummy cell transistor and having a first selection line connected to first selection transistor, the method comprising:

applying a programming voltage to a target programming word line connected to a gate of a programming target memory cell transistor and applying a pass voltage to the remaining word lines;

applying a first voltage to the first selection line; and applying a second voltage to the first dummy word line, wherein, if the programming target memory cell transistor is adjacent to the first dummy cell transistor, the second voltage has a voltage level between the first voltage and the programming voltage.

20. The programming method as claimed in claim 19, wherein, if the programming target memory cell transistor is not adjacent to the first dummy cell transistor, the second voltage has a voltage level of the pass voltage.

* * * * *